(12) United States Patent
Yamada (10) Patent No.: US 8,194,446 B2
(45) Date of Patent: *Jun. 5, 2012

(54) METHODS FOR PROGRAMMING A MEMORY DEVICE AND MEMORY DEVICES USING INHIBIT VOLTAGES THAT ARE LESS THAN A SUPPLY VOLTAGE

(75) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/051,380

(22) Filed: Mar. 18, 2011

(65) Prior Publication Data

US 2011/0164456 A1    Jul. 7, 2011

Related U.S. Application Data

(63) Continuation of application No. 12/430,282, filed on Apr. 27, 2009, now Pat. No. 7,916,546.

(51) Int. Cl.
*G11C 16/00*    (2006.01)

(52) U.S. Cl. ......... 365/185.02; 365/185.18; 365/185.23; 365/185.28

(58) Field of Classification Search ............ 365/195
See application file for complete search history.

(56) References Cited

U.S. PATENT DOCUMENTS

| | | | |
|---|---|---|---|
| 5,999,444 A * | 12/1999 | Fujiwara et al. ......... | 365/185.02 |
| 6,804,150 B2 | 10/2004 | Park et al. | |
| 6,987,694 B2 | 1/2006 | Lee | |
| 7,209,388 B2 | 4/2007 | Kanda | |
| 7,428,166 B2 * | 9/2008 | Joo ........................ | 365/185.02 |
| 7,916,546 B2 * | 3/2011 | Yamada .................... | 365/185.2 |

* cited by examiner

*Primary Examiner* — Tan T. Nguyen
(74) *Attorney, Agent, or Firm* — Leffert Jay & Polglaze, P.A.

(57) ABSTRACT

Methods for programming a memory array and memory devices are disclosed. In one such method, inhibited bit lines are charged to an inhibit voltage that is less than a supply voltage. The word lines of memory cells to be programmed are biased at a programming preparation voltage that is less than a nominal programming preparation voltage as used in the conventional art. Programming pulses can be applied to selected word lines of the memory cells to be programmed when the uninhibited bit lines are at 0V.

20 Claims, 11 Drawing Sheets

METHODS FOR PROGRAMMING A MEMORY DEVICE AND MEMORY DEVICES USING INHIBIT VOLTAGES THAT ARE LESS THAN A SUPPLY VOLTAGE

RELATED APPLICATION

This Application is a Continuation of Ser. No. 12/430,282, titled "METHODS FOR PROGRAMMING A MEMORY DEVICE AND MEMORY DEVICES THAT ARE LESS THAN A SUPPLY VOLTAGE" filed Apr. 27, 2009, now U.S. Pat. No. 7,916,546 (allowed), that is commonly assigned and incorporated herein by reference.

TECHNICAL FIELD

The present invention relates generally to memory and in a particular embodiment the present invention relates to non-volatile memory.

BACKGROUND

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the performance of the flash memory devices in the system should also increase so that accesses to the flash memory do not hinder system performance. Programming flash memory can be a time consuming process due, in part, to an RC coupling of the bit lines.

When a flash memory cell is being programmed, the bit lines coupled to the memory cells being programmed are held at a reference potential, such as 0V. The bit lines coupled to the memory cells not being programmed are biased at an inhibit voltage of $V_{CC}$ (the supply voltage of the memory device) prior to a programming pulse being applied to the memory cells being programmed. Charging the inhibited bit lines to $V_{CC}$ can be a relatively time consuming operation due to the RC factor slowing down the charging of the inhibited bit lines. Additionally, uninhibited bit lines adjacent to the inhibited bit lines are capacitively coupled to the inhibited bit lines and their voltage tends to follow the voltage on the inhibited bit lines. The memory is not programmed until the voltage of the uninhibited bit lines returns to 0V.

For the reasons stated above, and for other reasons stated below that will become apparent to those skilled in the art upon reading and understanding the present specification, there is a need in the art for faster programming of a memory device.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
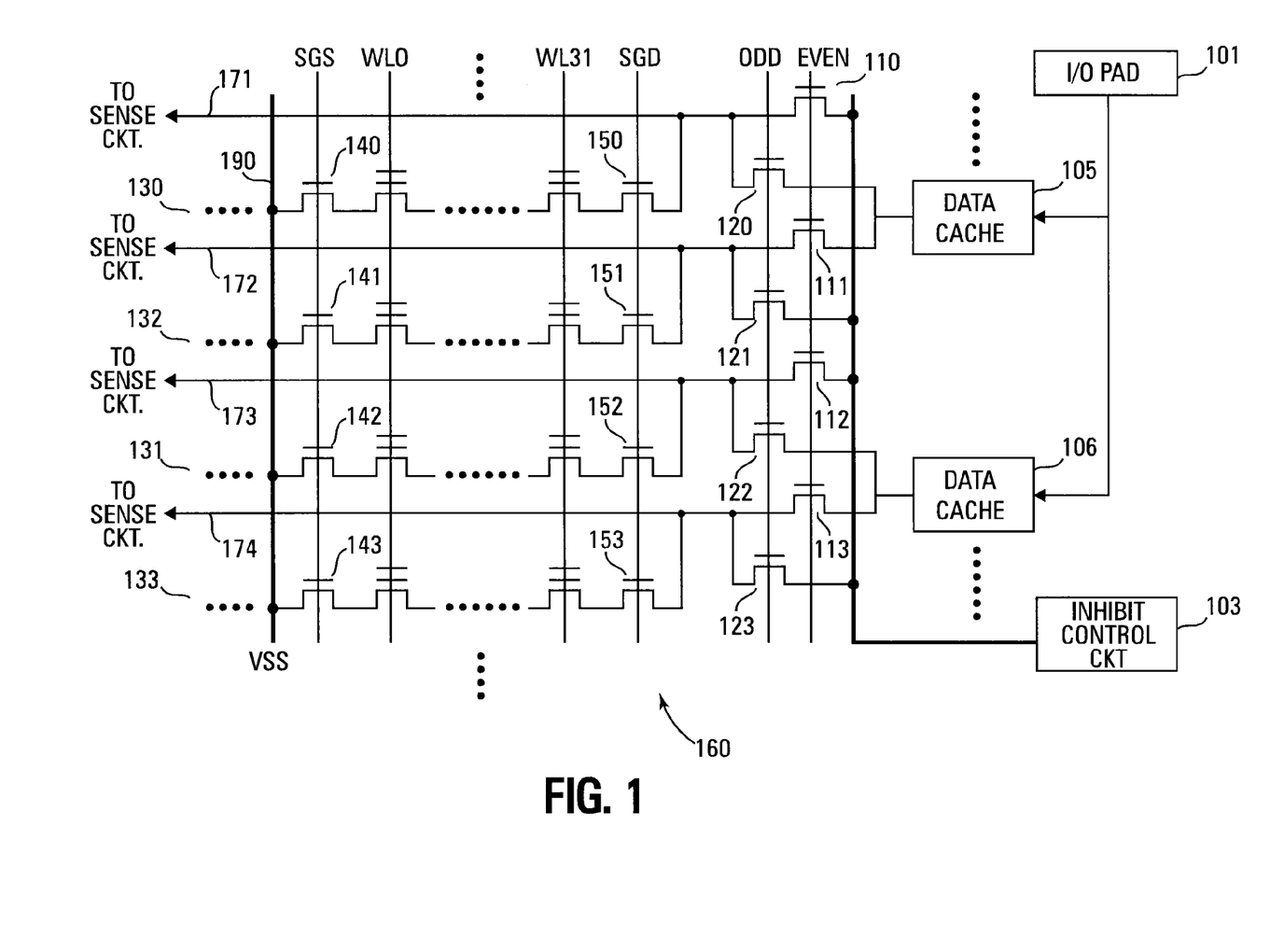
FIG. 1 shows a schematic diagram of one embodiment of a non-volatile memory array in accordance with a method for programming.

FIG. 1 illustrates a schematic diagram of a portion of a NAND architecture memory array comprising series strings of non-volatile memory cells on which the embodiments of the subsequently discussed programming method operate. While the subsequent discussions refer to a NAND memory device, the present embodiments are not limited to such an architecture but can be used in other memory device architectures as well.

The memory array is comprised of an array of non-volatile memory cells 160 (e.g., floating gate) arranged in columns such as series strings 130-133. Each of the cells 160 are coupled drain to source in each series string 130-133. An access line (e.g., word line) WL0-WL31 that spans across multiple series strings 130-133 is connected to (e.g., formed integral with) the control gates of each memory cell in a row in order to bias the control gates of the memory cells in that particular row. A data line (e.g., bit line) 170-173 is coupled to each series string 130-133 and is eventually coupled to sense circuitry (not shown) (e.g., sense amplifier) that detect the state of each cell by sensing, for example, current on a particular bit line 170-173.

The embodiment of FIG. 1 illustrates only four bit lines 170-173 and thirty-two word lines WL0-WL31. The illustrated quantity of bit lines and word lines is for purposes of clarity since a memory array can be comprised of substantially more of each element, depending on the memory density of the memory device comprising the memory array of FIG. 1.

The series strings 130-133 of memory cells are organized into odd and even series strings for purposes of programming. For example, one method for programming might program memory cells on the odd strings 130, 131 first and then memory cells on the even strings 132, 133. An alternate embodiment might first program the even strings 132, 133.

Each series string 130-133 of memory cells is coupled to a source line 190 $V_{SS}$ by a source select gate transistor 140-143 and to an individual bit line 170-173 by a drain select gate transistor 150-153. The source select gate transistors 140-143 are controlled by a source select gate control line SGS that is coupled to their control gates. The drain select gate transistors 150-153 are controlled by a drain select gate control line SGD that is coupled to their control gates.

Biasing of each bit line 170-173 for programming purposes is accomplished by an inhibit control circuit 103. The inhibit regulator circuit 103 generates the voltages to inhibit programming and, in some embodiments, also generates the voltages to permit programming. The inhibit control circuit 103 is discussed subsequently with reference to FIG. 2.

The inhibit control circuit 103 is coupled to each bit line 171-174 through a biasing control transistor 110, 112, 121, 123. The even bit lines 172, 174 are coupled to biasing control transistors 121, 123 that, when enabled by the ODD control line, enable biasing of the even bit lines 172, 174 with the proper voltage for the operation being performed. The odd bit lines 171, 173 are coupled to biasing control transistors 110, 112 that, when enabled by the EVEN control line, enable biasing of the odd bit lines 171, 173 with the proper voltage for the operation being performed.

An I/O pad 101 is the memory array's point of access to circuitry that is external to the memory device. As described subsequently with reference to FIG. 9, one embodiment of a flash memory device has a single I/O pad 101 to which data are input in a serial fashion.

The I/O pad 101 is coupled to a plurality of data caches 105, 106. The data caches 105, 106 are data latch circuits for temporarily storing data that have been input from the I/O pad 101 and are to be written to certain addressed memory cells as controlled by biasing of the word lines and the bit lines. The data caches 105, 106 also temporarily store data that have been read from addressed memory cells during a sense operation.

The data caches 105, 106, in one embodiment, are coupled to pairs of bit lines through data access transistors 111, 113, 120, 122. In the illustrated embodiment, each data cache 105, 106 is coupled to two different bit lines. For example, one data cache 105 is coupled to an even bit line 172 and an odd bit line 170 through their respective access transistors 111, 120. The second data cache 106 is coupled to another even bit line 174 and another odd bit line 173 through their respective access transistors 113, 122.

Each memory cell 160 can be programmed as a single level cell (SLC) or a multilevel cell (MLC), for example. Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC has multiple $V_t$ ranges that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

The memory cell array of FIG. 1 can be organized as erase blocks of memory cells and each erase block can be organized as pages of memory cells. An erase block might be 64 pages of single level cell data and 128 pages of multilevel cell data while each page might be comprised of 2048 bytes of data on 32 word lines.

Figure 2:
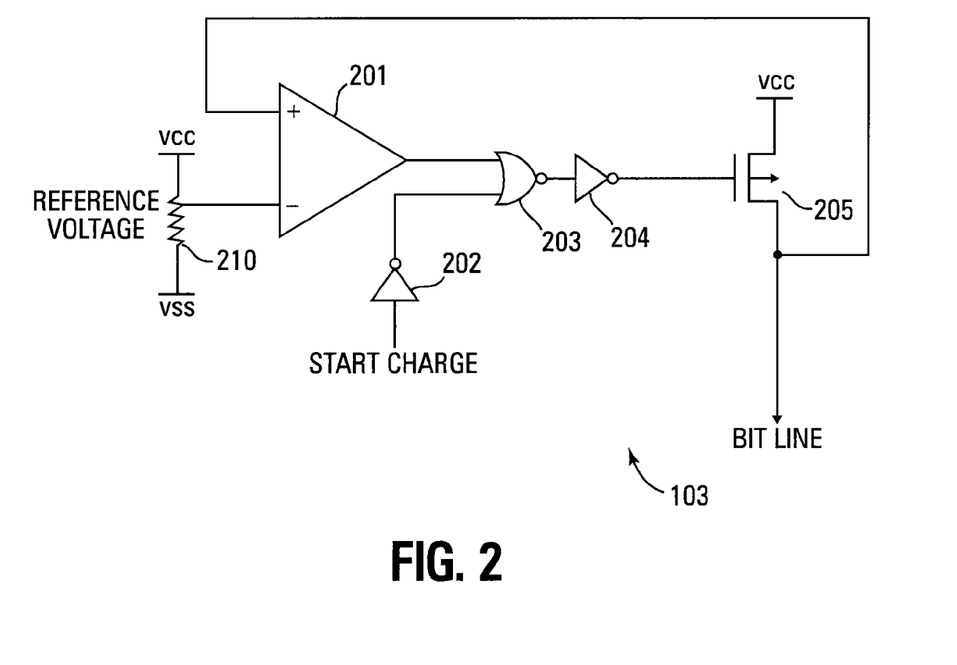
FIG. 2 shows a schematic diagram of one embodiment of an inhibit control circuit in accordance with the embodiment of FIG. 1.

FIG. 2 illustrates one embodiment of an inhibit control circuit 103. The inhibit control circuit 103 generates the voltages that bias the bit lines of the memory array of FIG. 1 during a programming operation.

As discussed previously, a bit line that is being programmed is biased at 0V to enable programming of the memory cells coupled to that particular bit line. Higher voltages on the bit line either slow or inhibit programming of coupled memory cells. The typical prior art inhibit voltage is $V_{CC}$ (i.e., supply voltage for the memory device). The inhibit control circuit 103 regulates the inhibit voltage below $V_{CC}$ once the bit line voltage reaches a particular percentage of $V_{CC}$. As long as the word line pass voltage ($V_{pass}$) is set low enough during the program operation, the NAND string channel does not need to be at full $V_{CC}$.

The circuit of FIG. 2 is comprised of an operational amplifier 201 that has a reference voltage input (−) and a feedback voltage input (+). The reference voltage input is coupled to a variable resistance 210 connected between $V_{CC}$ and $V_{SS}$. The operational amplifier 201 and variable resistance 210 make up a reference voltage circuit. The resistance 210 is set to have a voltage drop of a particular percentage of $V_{CC}$. This is the reference voltage input to the operational amplifier 201 reference input. When the input voltage to the feedback input is equal to the input voltage on the reference voltage input, the operational amplifier outputs an indication signal that, in this embodiment, would be a logical high signal.

A logical OR function 203, 204 is comprised of a NOR gate 203 and an inverter gate 204. One input of the NOR gate 203 is coupled to an inverted 202 START CHARGE signal. The other input to the NOR gate 203 is coupled to an output of the operational amplifier 201.

The START CHARGE signal is an indicator signal for the start of the program operation. The START CHARGE signal goes high during a preparation for programming operation, as illustrated in the timing diagram of FIG. 3, to indicate that the bit lines should be charged to their inhibit voltage.

The inhibit control circuit 103 is further comprised of a JFET transistor 205 with its drain connection coupled to $V_{CC}$ and its source connection coupled to one or more bit lines of the embodiment of FIG. 1. When the transistor gate is at ground potential (i.e., logical 0 from the inverter 204), the transistor 205 allows the flow of current from the $V_{CC}$ supply to charge the bit line. When the transistor is turned on by a logical high on its gate, the transistor 205 stops the flow of current through its channel, thus stopping the charging of the bit line.

In operation, the reference voltage of the operational amplifier is set to a particular percentage of $V_{CC}$ as determined by empirical experimentation. The reference voltage should be high enough to inhibit programming but low enough that charging of bit lines is relatively fast. The operational amplifier output is initially a logical low since the feedback voltage from the bit line is 0V and the reference voltage is some percentage of VCC. Since the START CHARGE signal is normally low, the inverted 202 signal is a logical high prior to a programming operation. Thus, the output of the logical OR function 203, 204 is a logical 1 that turns on the transistor 205 and stops the bit line from being charged from the $V_{CC}$ supply.

Once the programming operation is to begin, the memory controller brings the START CHARGE signal to a logical 1 and the output of the inverter 202 to a logical 0. Thus, the output of the logical OR function 203, 204 is now a logical 0 that turns off the transistor 205 and allows current to flow from the $V_{CC}$ supply through the transistor channel to the bit line in order to charge the bit line to the inhibit voltage (i.e., percentage of $V_{CC}$). Once the feedback voltage from the bit line reaches the reference voltage, the output of the operational amplifier outputs a logical 1 and turns on the transistor 205 to stop the flow of current from the $V_{CC}$ supply. The bit line is thus regulated at the particular percentage of $V_{CC}$ as the inhibit voltage. In this embodiment, the inhibit control circuit 103 acts as a voltage regulator.

Figure 3:
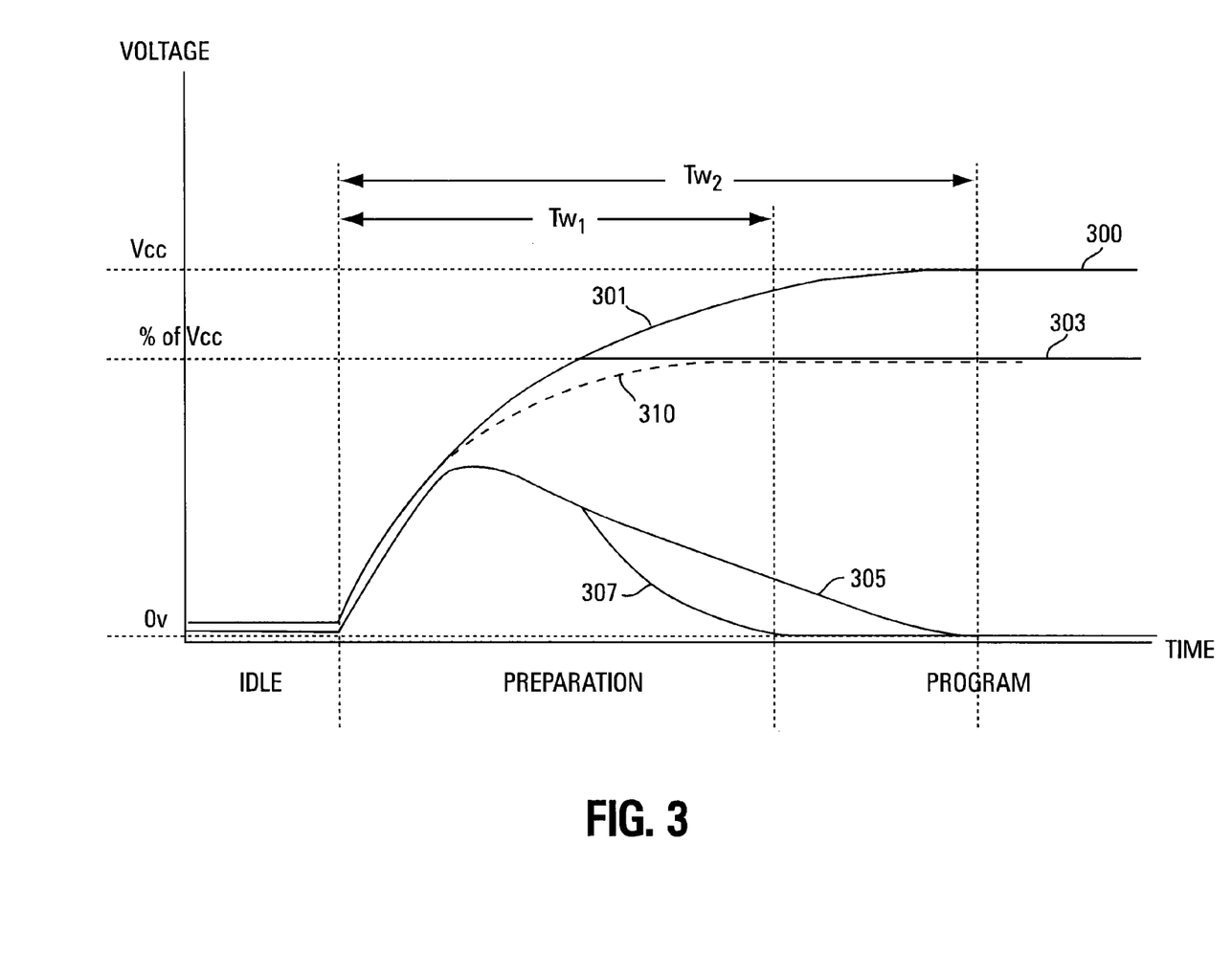
FIG. 3 shows a timing diagram of one embodiment of bit line inhibit and program voltages in accordance with the inhibit control circuit of FIG. 2.

FIG. 3 illustrates a timing diagram of the inhibit and program voltages in accordance with the inhibit control circuit 103 of FIG. 2. The timing diagram is divided up into the operational phases of IDLE, PREPARATION, and PROGRAM. The x-axis of the diagram is time and the y-axis is voltage. The diagram further shows the typical prior art inhibit voltage limit 300 of $V_{CC}$ and the % of $V_{CC}$ limit 303 of the present programming embodiments. $T_{w1}$ is the wait time, for the present programming embodiments, until the bit lines are prepared for the PROGRAM phase of the operation. $T_{w2}$ is the wait time, for the typical prior art programming operation, until the bit lines are prepared for the PROGRAM phase of the operation.

During the IDLE phase, the memory array is not being used and is therefore not being biased with any voltages. During the PREPARATION phase, the portion of the memory array to be programmed (e.g., erase block) is being prepared for the programming operation. During this phase, the bit lines coupled to memory cells not being programmed are charged to the inhibit voltage of a particular percentage of $V_{CC}$. The word lines of the erase block to be programmed are biased at a low voltage (e.g., 1V) that is less than the nominal word line preparation voltage, as discussed subsequently. During the PROGRAM phase, the bit lines are charged to the proper inhibit voltage and the program pulses are applied to the selected word lines of the memory cells being programmed.

The diagram of FIG. 3 shows that during the PREPARATION phase, the bit lines are charged. The typical prior art bit line charge 301 is shown going to the prior art $V_{CC}$ inhibit voltage. Due to capacitive coupling, charging the inhibited bit lines to this voltage causes the uninhibited bit lines 305 to also increase in voltage. It can be seen from FIG. 3 that these uninhibited bit lines are not back to 0V until time $T_{w2}$ has elapsed. At this point, the selected memory cells can be programmed.

The inhibited bit line 303 of the present embodiments is shown being charged to the lower limit 303 of a % of VCC. While capacitive coupling is still evident on the uninhibited bit line curve 307, it can be seen that the uninhibited bit lines return to 0V in a faster time of $T_{w1}$. Thus, the memory cells coupled to these bit lines are ready to be programmed sooner than the prior art bit line charging method.

Figure 4:
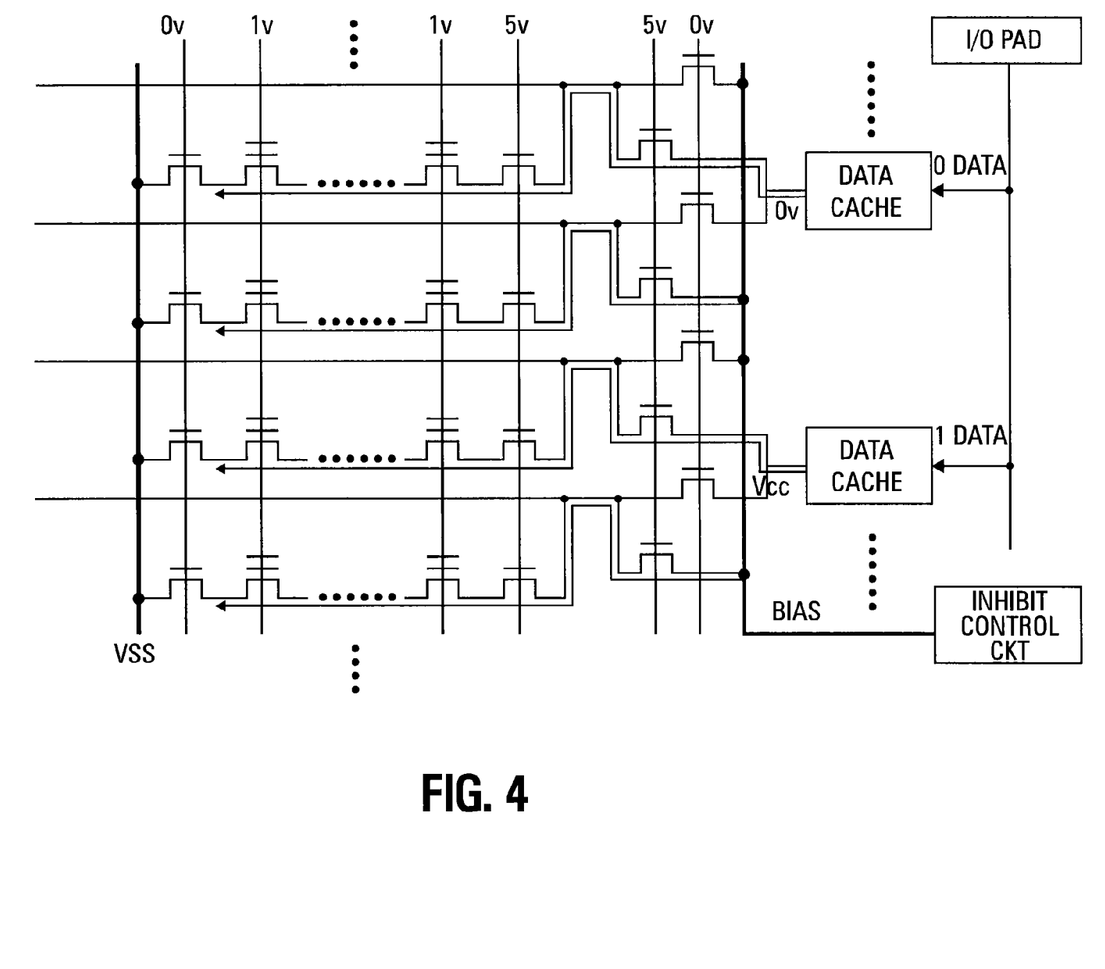
FIG. 4 shows a schematic diagram of one embodiment of biasing of the memory array of FIG. 1.

FIG. 4 illustrates the biasing of the word lines, select gates, and bit lines of the memory array of FIG. 1 during preparation for programming of one or more memory cells of the array. The actual voltages shown are for purposes of illustration as the present embodiments are not limited to any one voltage.

In the embodiment illustrated in FIG. 4, the word line voltage is half of the nominal prior art word line voltage of 2V. Since the channel voltage as set by the bit line bias is lower, the $V_{w}1-V_{channel}$ is substantially the same as the prior art $V_{w1}-V_{channel}$. For example, if the prior art used an inhibit voltage of $V_{CC}$ (e.g., 2.3V) and the word lines are biased with a voltage of 2V during the preparation phase of programming, the $V_{w1}-V_{channel}$ nominal difference voltage is 0.3V. If the new inhibit voltage of the present embodiments is set to 1.3V and the word lines are biased with a voltage of 1V, the $V_{w1}-V_{channel}$ difference is still 0.3V. This difference is effective at maintaining the program inhibit of the memory cells not being programmed.

FIG. 4 also shows the biasing of the select gate drain control lines at 5V to turn on those transistors and the biasing of the select gate source control lines at 0V to turn off those transistors during the up-coming programming operation. The ODD and EVEN control lines are biased at 5V and 0V respectively.

Figure 5:
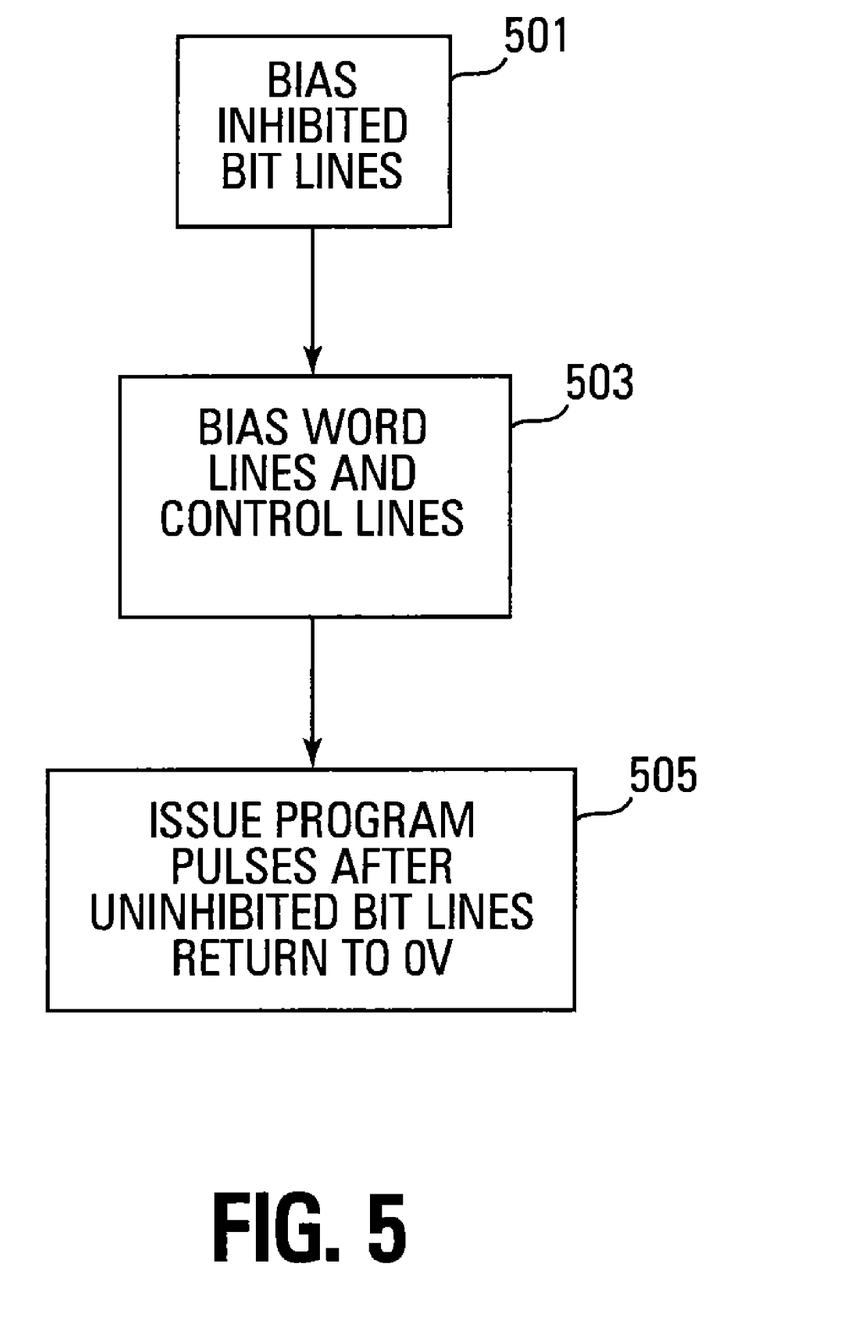
FIG. 5 shows a flowchart of one embodiment of a programming method in accordance with the embodiment of FIG. 1.

FIG. 5 illustrates a flowchart of one embodiment of a method for programming a non-volatile memory array. The method starts during the preparation phase, as shown in the timing diagram of FIG. 3, with the biasing of the inhibited bit lines 501 with the inhibit voltage that is a particular percentage of $V_{CC}$. The uninhibited bit lines are left at 0V.

The word lines and control lines (e.g., select gate drain, select gate source, ODD, EVEN) are biased at their target voltage 503. In one embodiment, the word lines are biased at 1V.

Once the uninhibited bit lines have returned to 0V from being coupled up during charging of the inhibited bit lines, program pulses are applied 505. During the programming phase of the operation, the unselected word lines are biased at a $V_{pass}$ voltage (e.g., 10V).

Figure 6:
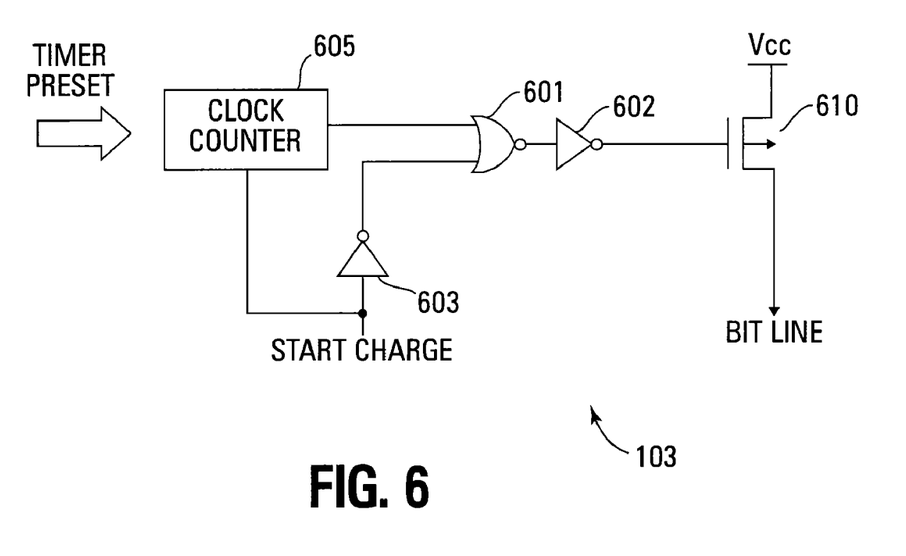
FIG. 6 shows a schematic diagram of an alternate embodiment of an inhibit control circuit in accordance with the embodiment of FIG. 1.

FIG. 6 illustrates an alternate embodiment of the inhibit control circuit 103. This circuit 103 does not regulate the bit line voltage, as in the embodiment of FIG. 2. In this embodiment, the bit line is left floating after either a particular voltage is detected on the bit line or after a particular time has elapsed.

The embodiment of FIG. 6 is comprised of a logical OR function 601, 602 that is comprised of a NOR gate 601 and an inverter gate 602. An inverted 603 START CHARGE signal is input to one side of the NOR gate 601. A clock counter 605 is input to the other side of the NOR gate 601.

In operation, the clock counter 605 is set to a particular time so that the clock counter 605 outputs a logical 1 signal when the preset time elapses. This time is determined by empirical experimentation as a time that is necessary to charge a bit line to a desired voltage.

Once the programming operation is to begin, the memory controller brings the START CHARGE signal to a logical 1 and the output of the inverter 603 to a logical 0. Thus, the output of the logical OR function 203, 204 is now a logical 0 that turns off the transistor 610 and allows current to flow from the $V_{CC}$ supply through the transistor channel to the bit line in order to charge the bit line for the desired time. Once the time has expired, the logical 1 output of the clock counter 605 turns on the transistor 610 to stop the flow of current from the $V_{CC}$ supply. The bit line is thereafter allowed to float and to be coupled up to a voltage close to the word line voltage.

Figure 7:
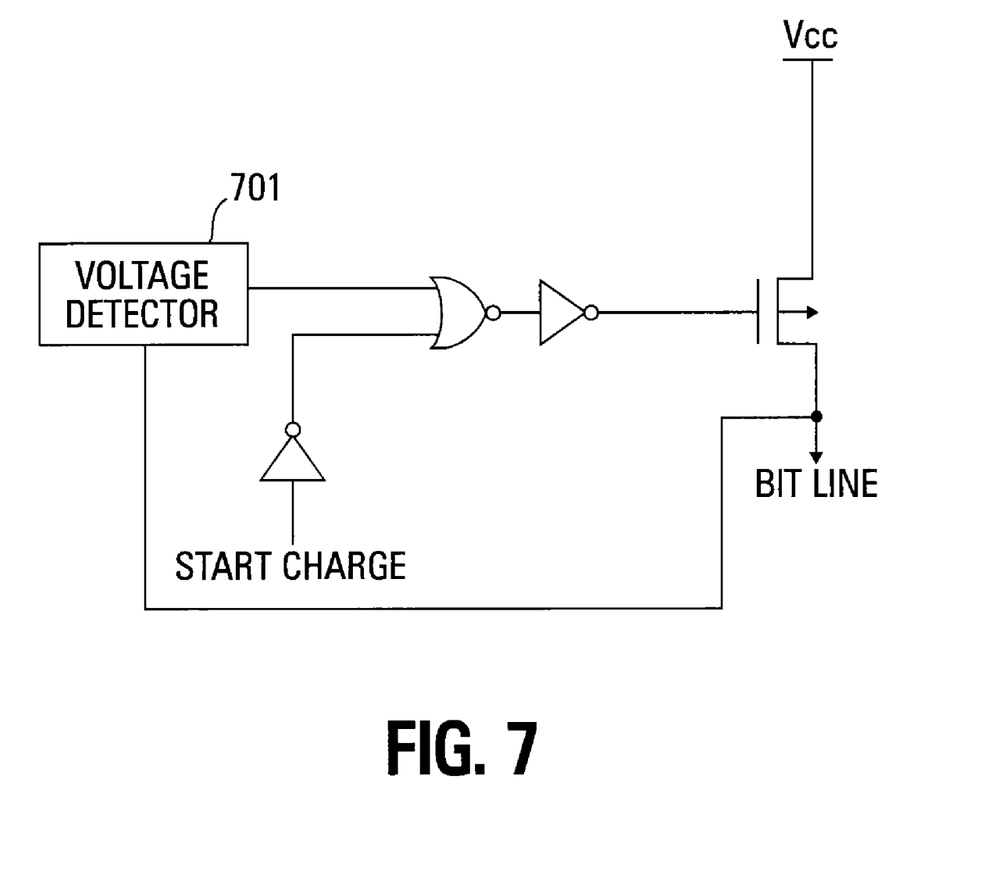
FIG. 7 shows a schematic diagram of yet another alternate embodiment of an inhibit control circuit in accordance with the embodiment of FIG. 1.

FIG. 7 illustrates an embodiment that is similar to that of FIG. 6. The embodiment of FIG. 7 replaces the clock counter of FIG. 6 with a voltage detector 701 that is coupled to the bit line. Once the bit line reaches the desired voltage, the voltage detector 701 outputs a logical 1 signal to turn on the transistor and allow the bit line to float.

Figure 8:
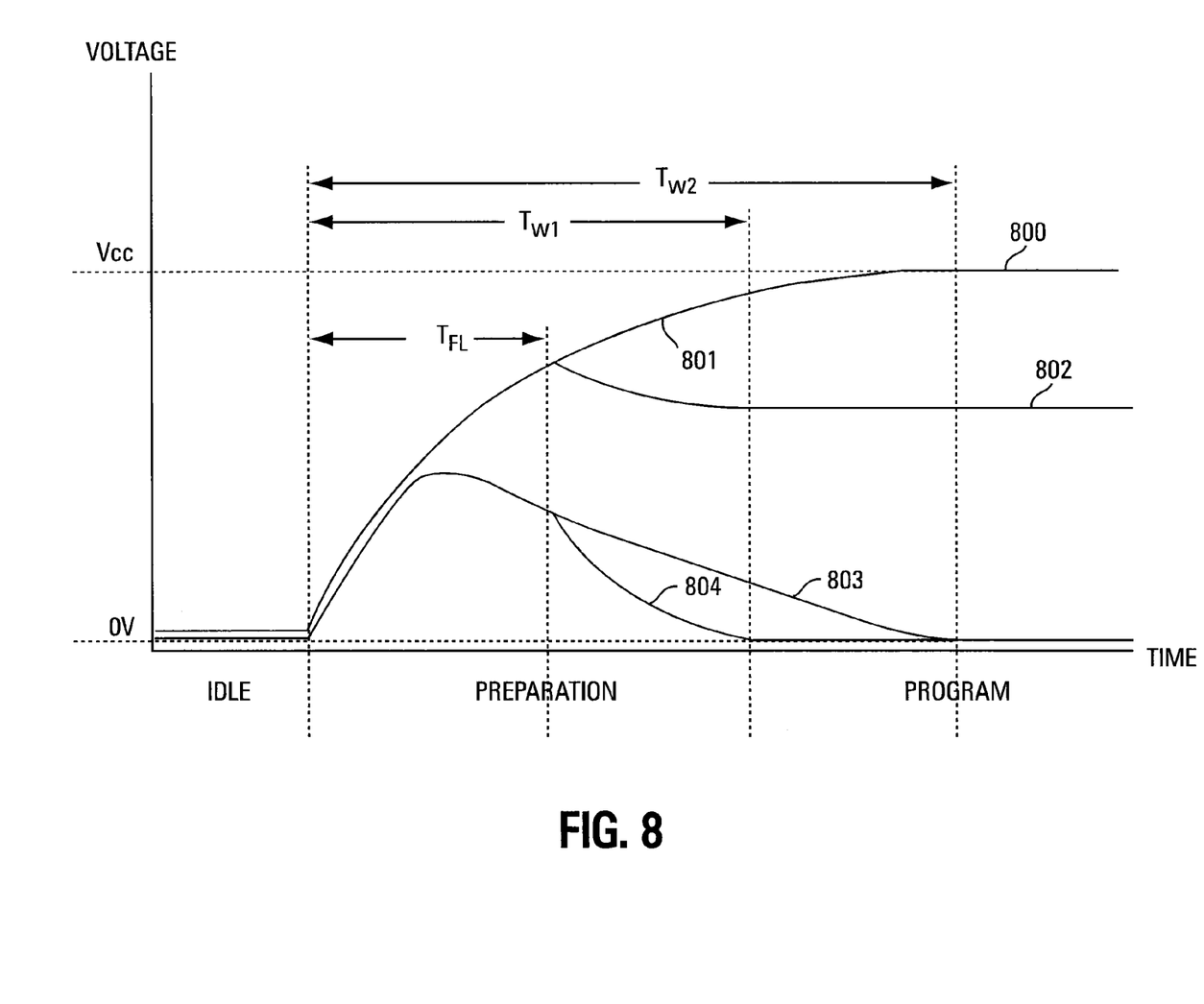
FIG. 8 shows a timing diagram of one embodiment of bit line inhibit and program voltages in accordance with the inhibit control circuit of FIG. 6.

FIG. 8 illustrates a timing diagram of one embodiment of bit line inhibit and program voltages in accordance with the inhibit control circuits of FIGS. 6 and 7. The timing diagram is divided up into the operational phases of IDLE, PREPARATION, and PROGRAM. The x-axis of the diagram is time and the y-axis is voltage. The diagram further shows the typical prior art inhibit voltage limit 800 of $V_{CC}$. $T_{w1}$ is the wait time, for the present programming embodiments, until the bit lines are prepared for the PROGRAM phase of the operation. $T_{w2}$ is the wait time, for the typical prior art programming operation, until the bit lines are prepared for the PROGRAM phase of the operation. $T_{FL}$ is the time after which the bit lines are allowed to float. This time is determined either by a particular time or a particular bit line voltage, as described previously.

This diagram shows that the prior art bit line inhibit voltage 801 goes to the prior art inhibit voltage of $V_{CC}$. This couples up the prior art program bit line voltage 803 so that it requires time $T_{w2}$ to settle back down to 0V for programming. However, with the embodiments of FIGS. 6 and 7, the bit lines are allowed to float after time $T_{FL}$ so that the inhibit bit line voltage 802 is reduced and the program bit line voltage 804 goes back to 0V for programming after time $T_{w1}$ where $T_{w1}$ is less than $T_{w2}$.

Figure 9:
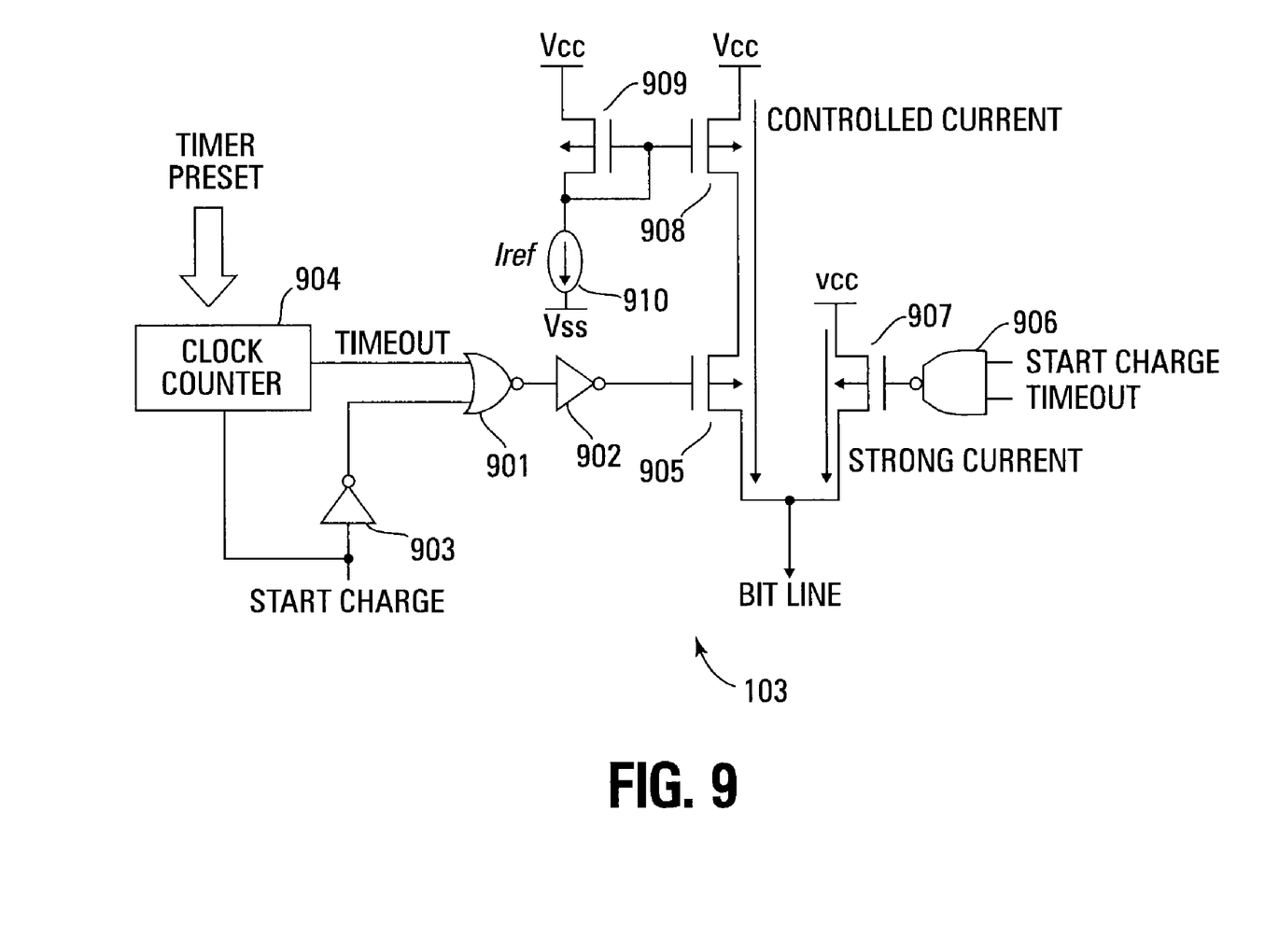
FIG. 9 shows a schematic diagram of another alternate embodiment of an inhibit control circuit in accordance with the embodiment of FIG. 1.

FIG. 9 illustrates a schematic diagram of another alternate embodiment of an inhibit control circuit 103 in accordance with the embodiment of FIG. 1. This embodiment is based on disabling of the current control for charging a bit line.

In a typical prior art memory device, the current to charge the bit lines is well controlled so that the supply current does not exceed the maximum specification. One drawback to this control is that the charging speed, and thus the programming speed, is reduced.

The embodiment illustrated in FIG. 8 is based on the fact that, once the charge current has passed a peak, the current naturally reduces as the charge operation proceeds. Thus, at some particular bit line voltage or time, the charge current control can be disabled. A strong, uncontrolled charge current can then take over to speed up the bit line charge operation. As long as the second current peak is less than the first, controlled peak, the affect on the supply current is negligible. However, the bit line charging speed is greatly improved over the prior art's controlled technique. The charge currents associated with this technique are illustrated in the timing diagram of FIG. 10 that is discussed subsequently.

The circuit of FIG. 9 provides the initial control of the charge current operation until either the bit line is charged to a particular voltage or a particular time has elapsed. A timing circuit of FIG. 9 is comprised of a logical OR function of a NOR gate 901 and an inverter 902. The START CHARGE signal is input to the NOR gate 901 through an inverter 903 so that the START CHARGE signal is inverted. A clock counter 904 with a timer preset has an input coupled to the START CHARGE signal and an output coupled to one input of the NOR gate 901. Another embodiment can replace the clock counter 904 with a voltage detector that is coupled to the bit line. In the first case, the timer is started by the START CHARGE signal and outputs a logical 1 TIMEOUT signal when the particular time has been reached. In the voltage detection embodiment, the voltage detector outputs a logical 1 signal when the bit line has reached the particular bit line voltage. This circuit controls the operation of a first transistor 905 that controls charging of a bit line.

The timing/voltage control portion 901-905 of the embodiment of FIG. 9 is substantially similar to the structure and operation of the embodiments of FIGS. 6 and 7. This is the portion of the FIG. 9 embodiment that provides the charge current control for a particular time/voltage. After this particular time/voltage, this control no longer operates and further uncontrolled charging is provided by an uncontrolled charging portion of the circuit 906, 907. The controlled $I_{CC}$ current is provided by a controlled current supply comprising an $I_{ref}$ current source 910 through two transistors 908, 909 that are coupled to $V_{CC}$.

The uncontrolled charging circuit is comprised of a logical NAND gate 906 having a first input coupled to the TIMEOUT signal from the counter/voltage detector 904. A second input to the logical NAND gate is coupled to the START CHARGE signal. When both the START CHARGE signal and the TIMEOUT signal are high indicating that the particular controlled charge time/voltage has been reached, the output of the logical NAND gate 906 will go low to turn off the transistor 907 and thus allow an uncontrolled $I_{CC}$ to flow from the supply to the bit line.

The logical NAND gate 906 is for purposes of illustration only. The logical NAND gate 906 acts as a logical combining function that outputs a control signal to the transistor 907 in response to the two input signals (i.e., START CHARGE and TIMEOUT). The logical true levels of these signals determines what type of logical function 906 is necessary.

Figure 10:
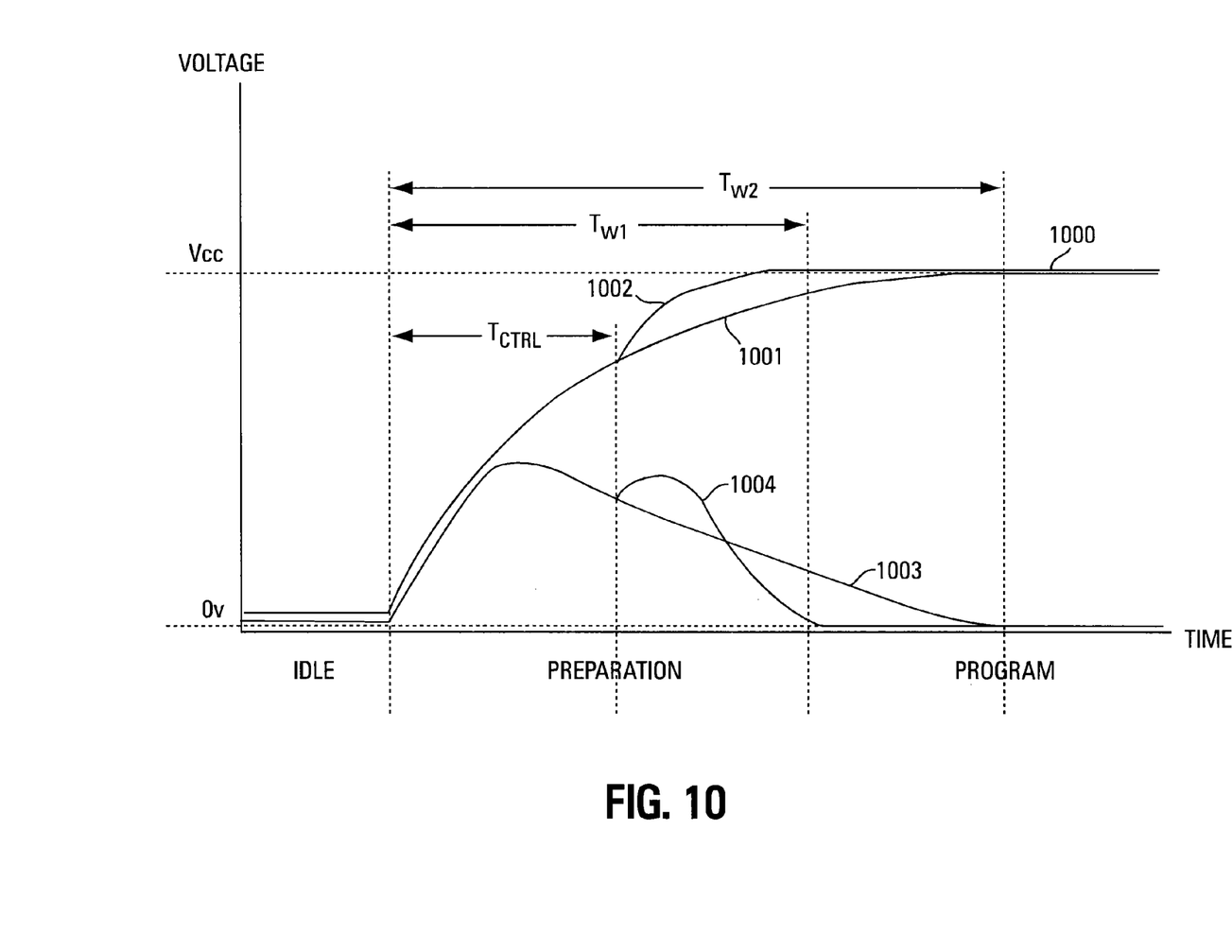
FIG. 10 shows a timing diagram of one embodiment of bit line inhibit and program voltages in accordance with the inhibit control circuit of FIG. 9.

FIG. 10 illustrates a timing diagram of one embodiment of bit line inhibit and program voltages in accordance with the inhibit control circuit of FIG. 9. The timing diagram is divided up into the operational phases of IDLE, PREPARATION, and PROGRAM. The x-axis of the diagram is time and the y-axis is voltage. The diagram further shows the typical prior art inhibit voltage limit 1000 of $V_{CC}$. $T_{w1}$ is the wait time, for the present programming embodiments, until the bit lines are prepared for the PROGRAM phase of the operation. $T_{w2}$ is the wait time, for the typical prior art programming operation, until the bit lines are prepared for the PROGRAM phase of the operation. $T_{CRTL}$ is the time during which the bit line charging is controlled. This time is determined either by a particular time or a particular bit line voltage, as described previously.

This diagram shows that the prior art bit line inhibit voltage 1001 goes to the prior art inhibit voltage of $V_{CC}$. This couples up the prior art program bit line voltage 1003 so that it requires time $T_{w2}$ to settle back down to 0V for programming. However, with the embodiment of FIG. 9, the bit line charging is no longer controlled after time $T_{CTRL}$ so that the inhibit bit line voltage 1002 and the program bit line voltage 1004 peak sooner. However, the program bit line voltage signal 1004 also goes back to 0V for programming after time $T_{w1}$ where $T_{w1}$ is less than $T_{w2}$.

Figure 11:
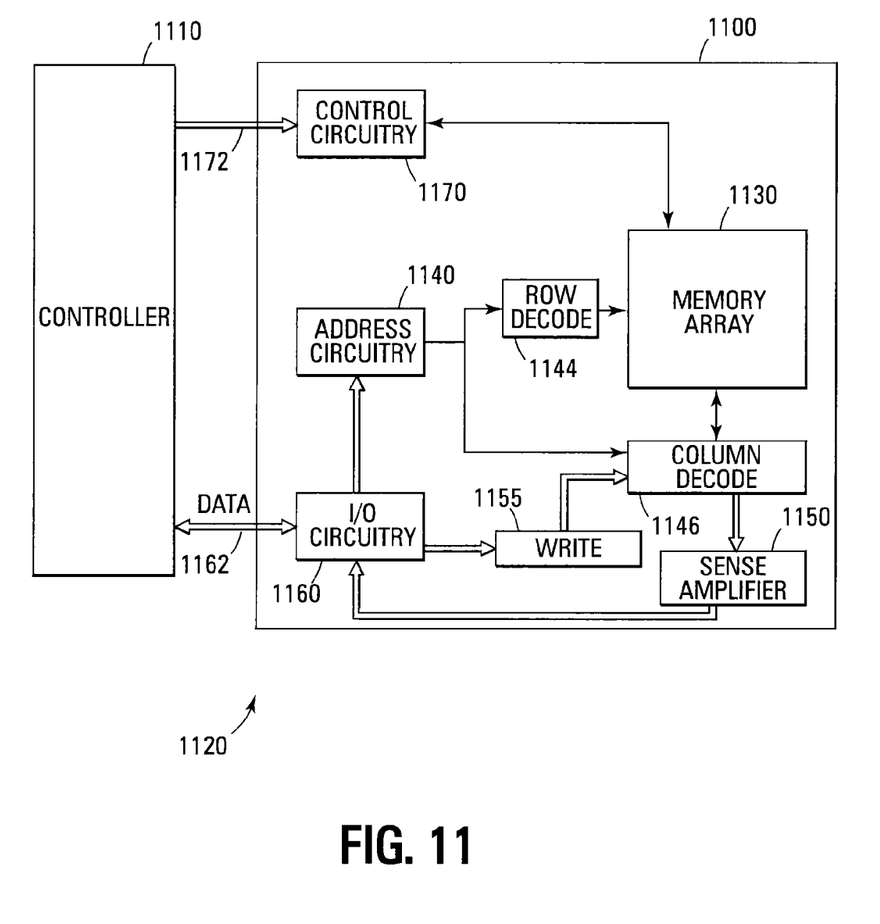
FIG. 11 shows a block diagram of one embodiment of a memory system that incorporates the memory array and inhibit control circuits of the present embodiments.

FIG. 11 illustrates a functional block diagram of a memory system 1120 that includes a non-volatile memory device 1100. The memory device 1100 has been simplified to focus on features of the memory that are helpful in understanding the present programming embodiments. The memory device 1100 is coupled to an external controller 1110. The controller 1110 may be a microprocessor or some other type of control circuitry.

The memory device 1100 includes an array 1130 of non-volatile memory cells, such as the ones illustrated in FIG. 1 discussed previously. The memory array 1130 is arranged in banks of access lines such as word line rows and data lines such as bit line columns. In one embodiment, the columns of the memory array 1130 are comprised of series strings of memory cells. As is well known in the art, the connections of the cells to the bit lines determines whether the array is a NAND architecture, an AND architecture, or a NOR architecture.

Address buffer circuitry 1140 is provided to latch address signals provided through the I/O circuitry 1160. Address signals are received and decoded by a row decoder 1144 and a column decoder 1146 to access the memory array 1130. It will be appreciated by those skilled in the art, with the benefit of the present description, that the number of address input connections depends on the density and architecture of the memory array 1130. That is, the number of addresses increases with both increased memory cell counts and increased bank and block counts.

The memory device 1100 reads data in the memory array 1130 by sensing voltage or current changes in the memory array columns using sense amplifier circuitry 1150. The sense amplifier circuitry 1150, in one embodiment, is coupled to read and latch a row of data from the memory array 1130. Data input and output buffer circuitry 1160 is included for bidirectional data communication as well as address communication over a plurality of data connections 1162 with the controller 1110. Write circuitry 1155 is provided to write data to the memory array.

Memory control circuitry 1170 decodes signals provided on control connections 1172 from the processor 1110. These signals are used to control the operations on the memory array 1130, including data read, data write (program), and erase operations. The memory control circuitry 1170 may be a state machine, a sequencer, or some other type of controller to generate the memory control signals. In one embodiment, the memory control circuitry 1170 is configured to control the bit line charging of the programming embodiments discussed previously.

CONCLUSION

In summary, one or more embodiments provide bit line charging control during a programming operation. The charging control reduces the time required to wait for a capacitively coupled, bit line to return to a reference voltage (e.g., 0V) before the programming operation can proceed, thus increasing programming speed.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory array, the method comprising:
    charging at least one inhibited data line for a particular time to a program inhibit voltage that is less than a supply voltage wherein the program inhibit voltage prevents programming of memory cells coupled to the at least one inhibited data line;
    allowing the at least one data line to float after the particular time; and
    applying a program pulse to control gates of selected memory cells.

2. The method of claim 1 wherein charging the at least one inhibited data line comprises charging the data lines of a memory erase block.

3. The method of claim 1 wherein charging the at least one inhibited data line comprises regulating the at least one inhibited data line at the program inhibit voltage.

4. The method of claim 3 wherein an inhibit control circuit performs the regulating of the program inhibit voltage below the supply voltage.

5. The method of claim 4 wherein regulating the program inhibit voltage comprises regulating the program inhibit voltage once the data line voltage reaches a particular percentage of the supply voltage.

6. The method of claim 1 and further comprising receiving an indicator signal that is configured to start the programming.

7. The method of claim 1 wherein charging the at least one inhibited data line comprises not controlling the charging after a particular time.

8. A method for programming a memory array, the method comprising:
    charging at least one inhibited data line to a program inhibit voltage that is less than a supply voltage while all uninhibited data lines are biased at 0V, wherein the program inhibit voltage is configured to prevent programming of memory cells coupled to the at least one inhibited data line; and
    applying a program pulse to control gates of selected memory cells.

9. A method for programming a memory array, the method comprising:
    charging inhibited data lines of the memory array to a program inhibit voltage that is less than a supply voltage wherein the program inhibit voltage inhibits programming of memory cells coupled to the inhibited data lines;
    floating the inhibited data lines of the memory array after the inhibited data lines have been charged to the program inhibit voltage; and
    applying a program pulse to control gates of selected memory cells.

10. The method of claim 9 and further including applying programming pulses to control gates of selected memory cells only after the uninhibited data lines have returned to a reference potential.

11. The method of claim 9 and further comprising applying a programming preparation voltage to control gates of the selected memory cells prior to the program pulse.

12. The method of claim 11 wherein the programming preparation voltage is substantially half of a nominal programming preparation voltage.

13. A memory device comprising:
    an array of memory cells coupled to data lines; and
    an inhibit control circuit coupled to at least one of the data lines wherein the inhibit control circuit is configured to generate an inhibit voltage that is less than a supply voltage, the inhibit control circuit comprising:
        a transistor coupled between a supply voltage and a data line and configured to control current flow to the data line;
        a clock circuit that outputs an elapsed time signal when a particular time has elapsed; and
        a logic circuit having an input coupled to the clock counter circuit output, an input coupled to an indicator signal for the start of a program operation, and an output coupled to a gate of the transistor wherein the logic circuit outputs a control signal to control operation of the transistor in response to both the elapsed time signal and the indicator signal for the start of the program operation.

14. The memory device of claim 13 wherein the inhibit control circuit further comprises a regulator circuit, coupled to the at least one of the data lines, that is configured to regulate the at least one of the data lines at the inhibit voltage.

15. The memory device of claim 14 wherein the regulator circuit comprises:

a transistor coupled to a data line such that the transistor controls current flow to the data line;
a reference voltage circuit that is configured to output an indication signal when the data line has been charged to the inhibit voltage; and
a logic circuit coupled to the transistor and configured to output a control signal to control operation of the transistor.

16. The memory device of claim 13 wherein the transistor is configured to stop current flow to the data line.

17. A memory device comprising:
an array of memory cells coupled to data lines; and
an inhibit control circuit coupled to at least one of the data lines wherein the inhibit control circuit is configured to generate an inhibit voltage that is less than a supply voltage, the inhibit control circuit comprising:
a transistor coupled between a supply voltage and a data line such that the transistor controls current flow to the data line;
a voltage detection circuit that outputs a voltage detection signal when the inhibit voltage has been detected on the data line; and
a logic circuit having an input coupled to the voltage detection circuit output, an input coupled to an indicator signal for the start of a program operation, and an output coupled to a gate of the transistor wherein the logic circuit outputs a control signal to control operation of the transistor in response to both the indicator signal for the start of the program operation and detection of the inhibit voltage.

18. A memory device comprising:
an array of memory cells coupled to data lines; and
an inhibit control circuit coupled to at least one of the data lines wherein the inhibit control circuit is configured to generate an inhibit voltage that is less than a supply voltage, the inhibit control circuit comprising:
a first transistor coupled between a controlled current source and a data line;
a second transistor coupled between a supply current source and the data line;
a clock circuit that outputs an elapsed time signal when a particular time has elapsed;
a first logic circuit having an input coupled to the clock circuit output, an input coupled to an indicator signal for the start of a program operation, and an output coupled to a gate of the first transistor wherein the first logic circuit outputs a control signal to control operation of the first transistor in response to both the elapsed time signal and the indicator signal for the start of the program operation; and
a second logic circuit having inputs coupled to both the elapsed time signal and the indicator signal for the start of the program operation wherein the logical combining function is configured to control operation of the second transistor in response to the elapsed time signal and the indicator signal for the start of the program operation.

19. The memory device of claim 18 wherein the inhibit control circuit is configured to supply current from one of the controlled current supply or the supply current.

20. A memory device comprising:
an array of memory cells arranged in series strings coupled to data lines; and
an inhibit control circuit coupled to the data lines wherein the inhibit control circuit is configured to generate an inhibit voltage that is less than a supply voltage, the inhibit control circuit comprising:
a first transistor coupled between a controlled current supply and a data line such that the first transistor controls a first current flow to the data line;
a second transistor coupled between a supply current source and the data line such that the second transistor controls a second current flow to the data line;
a voltage detection circuit, coupled to the data line, that outputs a voltage indication signal when data line reaches a particular data line voltage;
a first logic circuit having inputs coupled to the voltage detection circuit output and an indicator signal for the start of a program operation and an output coupled to a gate of the first transistor wherein the first logic circuit is configured to control operation of the first transistor; and
a second logic circuit having inputs coupled to both the voltage indication signal and the indicator signal for the start of the program operation wherein the second logic circuit is configured to control operation of the second transistor.

* * * * *